United States Patent
Wang et al.

[11] Patent Number: 6,113,685
[45] Date of Patent: Sep. 5, 2000

[54] METHOD FOR RELIEVING STRESS IN GAN DEVICES

[75] Inventors: Shih-Yuan Wang, Palo Alto; Yong Chen, Mountain View, both of Calif.

[73] Assignee: Hewlett-Packard Company, Palo Alto, Calif.

[21] Appl. No.: 09/152,848

[22] Filed: Sep. 14, 1998

[51] Int. Cl.[7] .................................................. C30B 25/10
[52] U.S. Cl. .................................. 117/3; 117/43; 117/45; 117/84; 117/89; 117/95; 117/952
[58] Field of Search ................................. 117/3, 43, 45, 117/84, 89, 95, 952

[56] References Cited

U.S. PATENT DOCUMENTS

| | | | |
|---|---|---|---|
| 5,141,894 | 8/1992 | Bisoro et al. | 437/132 |
| 5,496,766 | 3/1996 | Amano et al. | 117/952 |
| 5,598,014 | 1/1997 | Bovary et al. | 257/187 |
| 5,689,123 | 11/1997 | Major et al. | 257/190 |
| 5,932,896 | 8/1999 | Sugiura et al. | 257/94 |

FOREIGN PATENT DOCUMENTS

| | | |
|---|---|---|
| 0328408 | 8/1989 | European Pat. Off. . |
| 0871208 | 10/1998 | European Pat. Off. . |

OTHER PUBLICATIONS

Kelly et al., "Optical process for liftoff at Group III—Nitride Films", Physica Status Solids A vol. 159 No. 1 pp R3–4, Jan. 16, 1997.

IBM, Technical Disclosure Bulletin, Silicon on Sapphire Material Processing Vol. 23 p. 362, Jun. 1980.

Wong et al. "Damage free seporation of GaN thin films from Sapphire substates, " Applied Physics Letter, vol. 72(5) pp. 599–601.

*Primary Examiner*—Robert Kunemund

[57] ABSTRACT

An improved method for growing a first layer on a second layer in which the first and second layers have different thermal indices of expansion and/or a mismatch of the lattice constants and the deposition being carried out at a temperature above ambient. The first layer includes a material that decomposes upon beating above a decomposition temperature. One of the first and second layers absorbs light in a first frequency range and the other of the first and second layers is transparent to the light in the first frequency range. In the method of the present invention, the one of the first and second layers that absorbs light in the first frequency range is exposed to light in the first frequency range by passing the light through the other of the first and second layers. This exposure heats the first layer to a temperature above the decomposition temperature at the interface of the first and second layers after the first layer has been deposited on the second layer. The decomposition can also mean to physically remove the material by means such as chemical etching. The present invention is well suited to the deposition of III–V semiconducting materials on substrates such as sapphire.

9 Claims, 2 Drawing Sheets

LIGHT
14

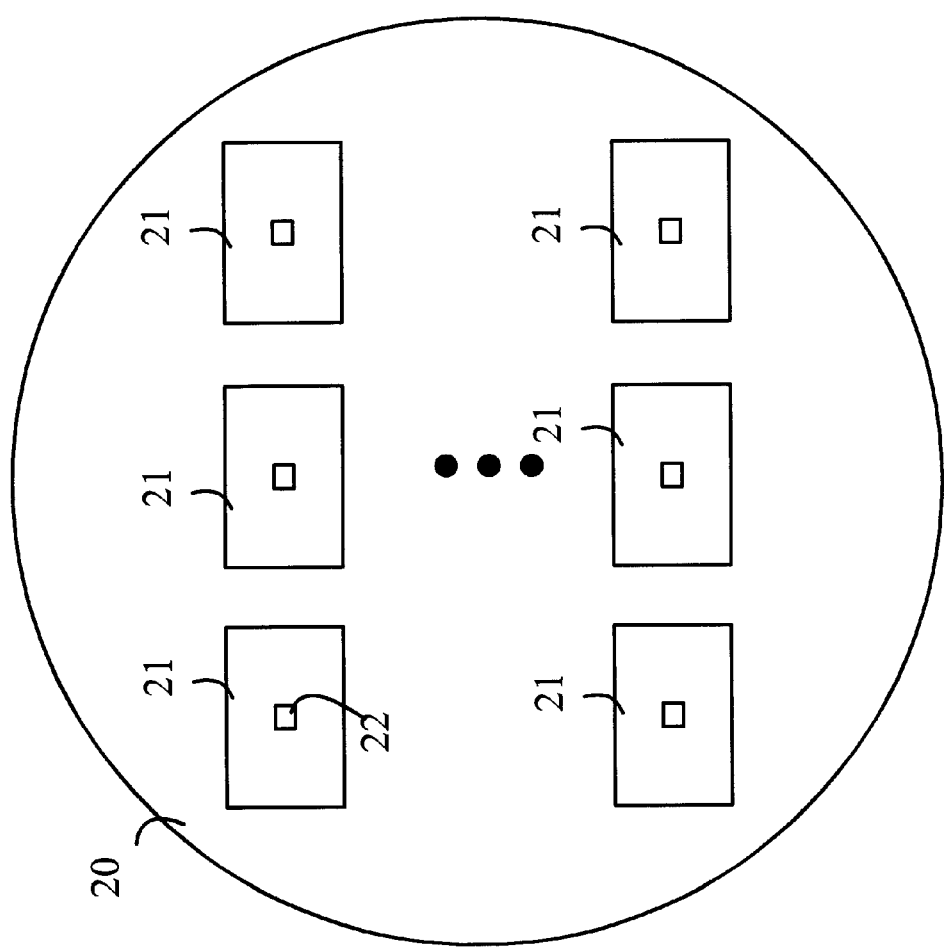

METHOD FOR RELIEVING STRESS IN GAN DEVICES

FIELD OF THE INVENTION

The present invention relates to the fabrication of semiconductors based on GaN and similar materials, and more particularly, to a method for relieving the stress generated when layers of such materials are grown on a substrate or other layer having a thermal expansion coefficient and/or lattice constant that differs markedly from that of GaN or the layer being grown.

BACKGROUND OF THE INVENTION

III–V materials such as GaN are particularly useful in constructing lasers and LEDs in the blue and green wavelengths. To simplify the following discussion, a reference to GaN is to be understood as including the entire GaN material system of GaN, AlN, InN, AlGaN, InGaN, AlGaNP, AlGaNAs, InGaNP, InGaNAs, etc. unless the context makes it clear that only GaN is intended. These layers are typically deposited on a sapphire substrate. Consider a layer of GaN grown on a sapphire substrate. The growth temperature is typically in the range of 700 to 1200° C. The thermal coefficient of expansion of GaN and AlN is significantly different than that of sapphire along certain planes. Hence, when the substrate and GaN layers are returned to room temperature a significant thermal stress is applied to the GaN layer. This stress leads to fractures and voids in the GaN layer. In addition, the wafer may be warped by the stress generated at the GaN/sapphire interface.

In addition to thermal stress, stress resulting from the mis-match of the lattice constants between the GaN and sapphire layers also causes problems. For example, the lattice constant for GaN differs from that of sapphire by approximately 13–16%. During the growth of the GaN layer, the substrate and the GaN layer tend to keep their original lattice parameters; hence, there is a mismatch between the lattice parameters between the two layers. This mismatch generates stress in the GaN layer which, in turn, leads to defects in the layer.

Broadly, it is the object of the present invention to provide an improved method for growing group III–V layers on a substrate having a substantially different coefficient of thermal expansion and/or lattice constant than the layer being grown.

It is a further object of the present invention to provide a method for growing GaN on sapphire in which the thermal stress generated by growing the layer can be relieved.

These and other objects of the present invention will become apparent to those skilled in the art from the following detailed description of the invention and the accompanying drawings.

SUMMARY OF THE INVENTION

The present invention is an improved method for growing a first layer on a second layer in which first and second layers have different thermal indices of expansion and/or lattice constants and the deposition being carried out at a temperature above ambient. The first layer includes a material that decomposes upon heating above a decomposition temperature. One of the first and second layers absorbs light in a first frequency range and the other of the first and second layers is transparent to the light in the first frequency range. In the method of the present invention, the one of the first and second layers that absorbs light in the first frequency range is exposed to light in the first frequency range by passing the light through the other of the first and second layers. This exposure heats the first layer to a temperature above the decomposition temperature at the interface of the first and second layers after the first layer has been deposited on the second layer. The present invention is well suited to the deposition of III–V semiconducting materials on substrates such as sapphire.

BRIEF DESCRIPTION OF THE DRAWINGS

FIG. 2 is a top view of a wafer having isolated GaN regions.

DETAILED DESCRIPTION OF THE INVENTION

Figure 1:
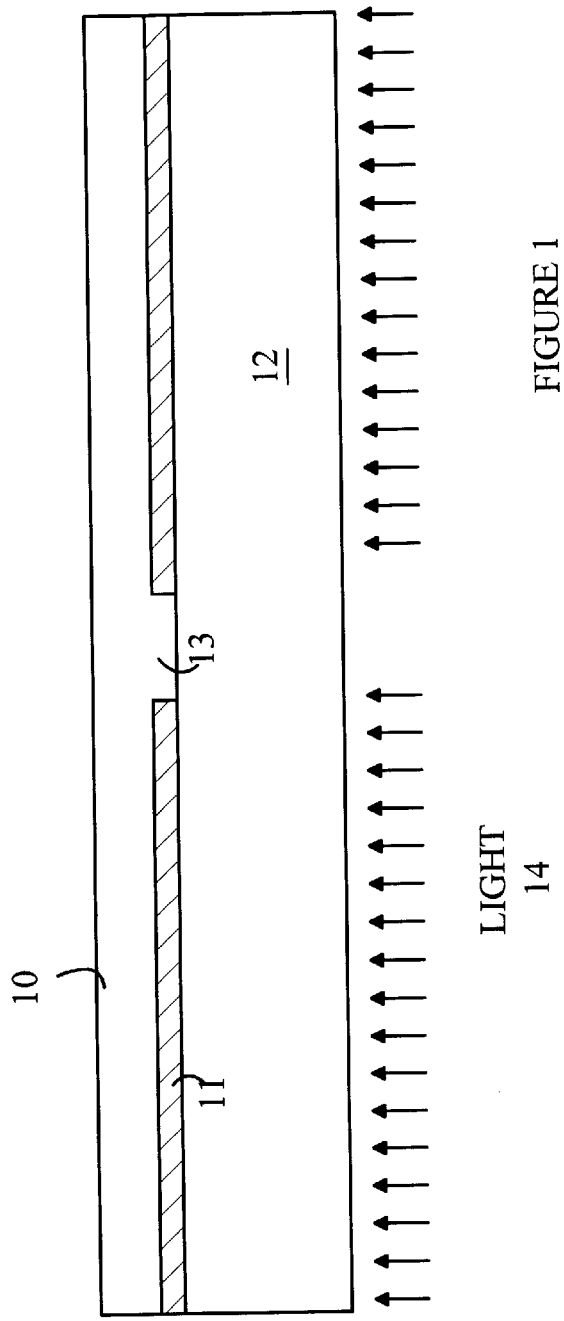
FIG. 1 is a cross-sectional view of a GaN layer grown on a sapphire substrate.

The manner in which the present invention gains its advantages may be more easily understood with reference to FIG. 1, which is a cross-sectional view of a GaN layer 10 that has been epitaxially grown on a sapphire substrate 12. As noted above, the growth temperatures to which both the GaN and sapphire are subjected are typically 700 to 1200 C. When the layer and sapphire substrate cool, the GaN contracts differently than the sapphire. Hence, thermally induced stress and lattice mismatch stress are generated in the GaN layer, which leads to defects in the GaN layer. Such defects decrease the yield of devices constructed on the GaN layer. Since the GaN layer is much thinner than the sapphire substrate, this stress can also cause cracks and voids to form in the GaN layer.

The present invention is based on the observation that the GaN at the GaN/sapphire interface can be decomposed by exposing the GaN at the interface to UV light 14 in the range of power densities of 5–20 megawatts/cm$^2$ at a wavelength of 248 nm. The GaN is opaque to UV at this wavelength. Sapphire, on the other hand, is transparent to UV light with a wavelength of 248 nm. Hence, UV light directed at the GaN/sapphire interface through the sapphire substrate heats the layer of material 11 at the interface. The GaN is heated to a temperature at which it decomposes into Ga and N. This procedure has been used to separate GaN thin films from sapphire (W. Wong, T. Sands; 10th Conference on Semiconductor and Insulating Materials, June 1998, Berkeley, Calif., paper Th2.2). For example, GaN layers can be removed from sapphire by exposing the GaN/sapphire interface to UV light from a UV laser that irradiates the interface from the sapphire side. The sapphire is then heated to a temperature above the melting point of Ga. At this temperature, the GaN layer can be removed from the sapphire substrate by sliding the GaN layer off of the substrate. This technique, of course, assumes that the GaN layer is sufficiently thick to be self supporting.

In the preferred embodiment of the present invention, the GaN/sapphire interface is subjected to heating via the laser after the GaN layer has been grown but before the GaN/sapphire has been returned to room temperature. The GaN layer and sapphire substrate are then returned to room temperature. The resulting liquid Ga layer at the interface allows the GaN layer to move relative to the sapphire substrate during the cooling process, and hence, the thermal stress normally induced in the GaN layer is eliminated.

After the Ga cools below its melting point, the metallic Ga layer is still malleable, hence, any significant thermally induced stress in subsequent processing operations is also reduced. It should be noted that pure Ga melts at about 30° C. Hence, the GaN layer is subjected to very little additional stress by the solidification of the liquid Ga layer.

It is advantageous to have the GaN layer bonded to the sapphire substrate during subsequent processing operations. The sapphire substrate is much thicker than the various layers used to construct devices such as lasers. Hence, the sapphire substrate prevents damage to the devices during subsequent handling and processing. Accordingly, not all of the GaN layer at the GaN/sapphire interface is decomposed in the preferred embodiment of the present invention. In the preferred embodiment of the present invention, one or more "islands" of GaN are left intact by restricting the laser irradiation such that the GaN layer in the region of the islands is not irradiated. The island can be created by masking the beam or by using a scanning laser beam that is turned off when over the island areas. Such an island is shown at 13 in FIG. 1. The non-irradiated areas are not heated to a sufficient temperature to decompose the GaN in those regions. These regions serve as bonding points. A single bonding point in the center of the substrate is sufficient to provide the necessary attachment while allowing the GaN layer to move relative to the substrate during cooling or during further epitaxial growth.

While the above described embodiments decomposed the GaN near the GaN/sapphire interface while the GaN/sapphire structure was at or near the GaN growth temperature, the decomposition and stress relief can be carried out after the GaN/sapphire has cooled. In this case, the GaN/sapphire interface is irradiated after the GaN/sapphire has been removed from the reaction chamber. Under these conditions, the GaN layer will be under stress from the difference in thermal indicies of expansion and lattice constants. This stress is then reduced by decomposing the layer of GaN at the interface as described above. Refer now to FIG. 2, which is a top view of a wafer 20. If a plurality of devices are to be constructed on the GaN layer, the GaN layer can be etched prior to the stress relief so that each device is constructed on its own separated GaN pad 21. A small island 22 in the center of each pad can then be left, as described above, to assure that the GaN layer and subsequent layers remain bonded to the sapphire substrate. The stress relieved GaN pads 21 are then subjected to farther epitaxial growth of layers such as AlGaN. InGaN, GaN etc. to complete the GaN lasers. The epitaxial growth on these stress relieved GaN layers will be subjected to significantly less stress due to the sapphire substrate. Hence, the resulting layers will have superior electrical and optical qualities. In the case of FIG. 2, after the GaN pads 21 are fabricated by etching channels, the channels are then filled with a dielectric material to prevent future growth from attaching to the sapphire substrate.

It should be noted that the stress relieved layer created by decomposing the GaN at the GaN/sapphire interface can be used as seed layer for growing subsequent high quality GaN material. In such embodiments a very thin GaN layer (<2000 nm) is grown on the sapphire and a portion of the thin layer is then decomposed using UV irradiation as described above. This floating seed layer is no longer subjected to the lattice or thermal stresses associated with the sapphire. Hence, a subsequent layer grown thereon will also be free of these stresses.

The above described embodiments of the present invention have utilized GaN on sapphire. However, the method of the present invention may be applied to other material systems. For example, a floating SiC layer grown on a sapphire or silicon substrate can be generated by decomposing the SiC into Si and C. Similarly, the GaN layer may be grown on other substrates such as silicon. In this case, the silicon is heated by light of a wavelength that passes through the GaN and heats the substrate at the GaN/substrate interface. The heat, in turn, decomposes the GaN at the GaN/silicon interface.

An intermediate absorption layer may be utilized in material systems in which the material at the interface does not have the desired absorption band. For example, a thin GaN layer can be grown over the substrate and the desired layer grown on the GaN layer. The GaN layer can then be decomposed as described above leaving the desired layer floating over the substrate.

Such an intermediate layer can also reduce the power densities needed to detach the desired layer. For example, a GaAs layer can be used as an intermediate absorption layer with GaN grown over the GaAs. The energy required to decompose the GaAs is significantly less than that required to decompose the GaN. In addition, GaAs or InP can be utilized as a substrate for growing the GaN layer.

The above-described embodiments of the present invention have been discussed with reference to a GaN layer on a sapphire substrate. However, it will be obvious to those skilled in the art from the preceding discussion that the method of the present invention can be practiced with any two layer system in which one of the layers is transparent to the light and the material of one of the layers can be decomposed. For example, Si/sapphire can be processed in a manner analogous to that described above. Similarly, a layer of GaP on a layer of GaAs can be processed using a layer in the visible region, since GaP is transparent and GaAs is opaque in the green region of the optical spectrum.

While the above-described embodiments of the present invention have utilized light as the energy source for decomposing the interface layer, it will be obvious to those skilled in the art from the preceding discussion that other energy sources may be utilized without departing from the teachings of the present invention. Furthermore, as used herein, the term "light" is deemed to include electromagnetic radiation of any wavelength.

It should also be noted that the layer that decomposes at the interface need not be the layer that is opaque to the light. For example, the present invention may be applied in systems in which the substrate is opaque and the deposited layer is transparent. The interface between the two layers is heated by applying the light through the transparent layer to heat the substrate at the interface. The heated substrate, in turn, decomposes the material in the transparent layer or the substrate material at the interface.

Figure 3:
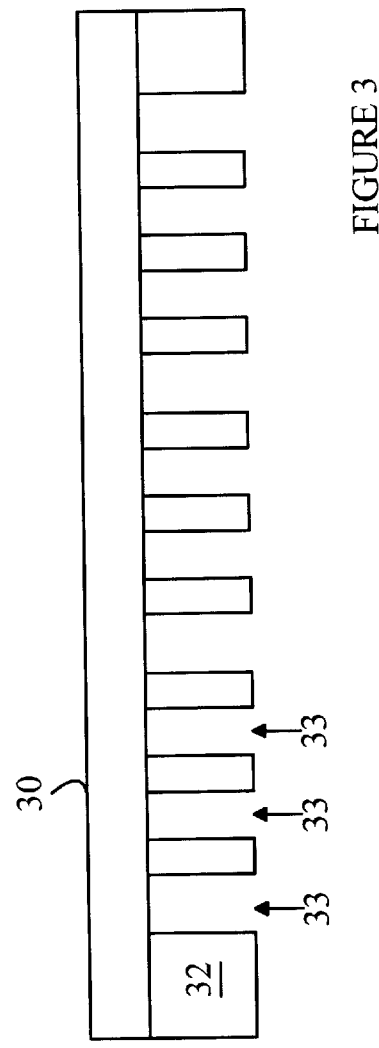
FIG. 3 is a cross-sectional view of another embodiment of the present invention.

The above-described embodiments of the present invention have utilized heating of the interface between the GaN and substrate to remove material that transmitted the stress between the two layers. However, other methods of removing this material may also be utilized. Referring to FIG. 3, holes 33 can be etched in the substrate 32 from the bottom of the substrate after the GaN layer 30 has been deposited to create regions in which the deposited layer is freed from the substrate. These stress-relieved areas can then be used to seed further growth or construct devices. In the limit, the substrate can be reduced to a honeycomb that supports the final GaN layer while leaving most of the GaN layer suspended between the webs of the honeycomb.

Various modifications to the present invention will become apparent to those skilled in the art from the foregoing description and accompanying drawings.

Accordingly, the present invention is to be limited solely by the scope of the following claims.

What is claimed is:

1. In a method for depositing a first layer on a second layer wherein said first and second layers have different thermal indices of expansion and/or lattice constants, the improvement comprising the step of decomposing a portion of one of said first and second layers after said first layer has been deposited on said second layer, said decomposed portion comprising a portion of said one of said first and second layers at the interface of said first and second layers.

2. The method of claim 1 wherein said step of decomposing a portion of one of said first and second layers comprises etching holes in said second layer from the side of said second layer that is not in contact with said first layer.

3. The method of claim 1 wherein said one of said first and second layers that is decomposed is said first layer, said first layer comprising a material that decomposes upon heating above a decomposition temperature, wherein one of said first and second layers absorbs light in a first frequency range and the other of said first and second layers is transparent to said light in said first frequency range, and wherein said step of decomposing said portion of said one of said first and second layers comprises the step of exposing said one of said first and second layers that absorbs light in said first frequency range to light in said first frequency range by passing said light through the other of said first and second layers thereby heating said first layer to a temperature above said decomposition temperature at the interface of said first and second layers after said first layer has been deposited on said second layer.

4. The method of claim 3 wherein said first layer comprises a III–V semiconductor.

5. The method of claim 4 wherein said III–V semiconductor comprises GaN.

6. The method of claim 4 wherein said second layer comprises a material chosen from the group consisting of sapphire, silicon, GaAs and InP.

7. The method of claim 3 wherein a portion of said first layer is not heated above said decomposition temperature at said interface between said first and second layers.

8. The method of claim 3 wherein said first layer is deposited at a temperature above ambient and wherein said first layer is heated to said temperature above said decomposition temperature before said first layer is returned to ambient after said first layer has been deposited.

9. The method of claim 3 wherein said first layer comprises a decomposition layer in contact with said substrate and a third layer, said second and third layers sandwiching said decomposition layer, said decomposition layer decomposing at a temperature less than the temperature at which said second and third layers decompose but greater than said temperature at which said deposition is carried out.

\* \* \* \* \*